(12) United States Patent
Chong, Jr.

(10) Patent No.: US 7,742,292 B1
(45) Date of Patent: Jun. 22, 2010

(54) COMPONENT ARRAY BRACKET ASSEMBLY

(75) Inventor: Fay Chong, Jr., Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 834 days.

(21) Appl. No.: 10/800,095

(22) Filed: Mar. 12, 2004

(51) Int. Cl.
*H05K 5/00* (2006.01)
*A47B 95/02* (2006.01)
*B65D 85/00* (2006.01)
*G11B 33/02* (2006.01)

(52) U.S. Cl. .................... 361/679.39; 361/679.33; 361/379.37; 361/679.38; 361/727; 312/332.1; 312/333; 206/701; 369/75.11

(58) Field of Classification Search ............... 361/685, 361/727
See application file for complete search history.

(56) References Cited

U.S. PATENT DOCUMENTS

| | | | |
|---|---|---|---|
| 4,445,740 A | 5/1984 | Wallace | |
| 4,982,303 A | 1/1991 | Krenz | |
| 5,010,426 A | 4/1991 | Krenz | |
| 5,317,481 A | 5/1994 | Hillis et al. | |
| 5,325,263 A | 6/1994 | Singer et al. | |
| 5,442,502 A | 8/1995 | Shimizu | |
| 5,586,003 A | 12/1996 | Schmitt et al. | |
| 5,668,696 A | 9/1997 | Schmitt | |
| 5,721,669 A | 2/1998 | Becker et al. | |
| 5,751,559 A | 5/1998 | Jensen et al. | |
| 5,959,956 A | 9/1999 | Takishima | |
| 5,975,735 A | 11/1999 | Schmitt | |
| 6,067,225 A | 5/2000 | Reznikov et al. | |
| 6,272,005 B1 | 8/2001 | Jensen et al. | |
| 6,288,911 B1 | 9/2001 | Aoki et al. | |
| 6,325,353 B1* | 12/2001 | Jiang | 248/682 |
| 6,332,658 B1 | 12/2001 | Sato et al. | |
| 6,378,965 B1 | 4/2002 | Reznikov et al. | |
| 6,394,509 B1* | 5/2002 | Kurek, III | 292/199 |
| 6,411,505 B1 | 6/2002 | DiFonzo et al. | |
| 6,411,517 B1 | 6/2002 | Babin | |
| 2003/0039100 A1* | 2/2003 | Salinas | 361/727 |
| 2005/0047075 A1* | 3/2005 | Roesner | 361/685 |

* cited by examiner

*Primary Examiner*—Zachary M Pape
(74) *Attorney, Agent, or Firm*—Martine Penilla & Gencarella, LLP

(57) ABSTRACT

A component positioning and securing bracket assembly includes a front rail, a rear rail, and a bottom rail to define a front, a rear, and a bottom boundary of the component positioning and securing bracket assembly. The front rail, the rear rail, and the bottom rail define a structure into which is received the component in a first direction of movement, and a lever provides leveraged motion in a second direction of movement to connect a port of the component to a component connector and to secure the component in the component positioning and securing bracket assembly. The component positioning and securing bracket assembly is in an array of a plurality of components, in which any one component can be installed or removed without installing or removing any other component in the array.

16 Claims, 12 Drawing Sheets

COMPONENT ARRAY BRACKET ASSEMBLY

CROSS REFERENCE TO RELATED APPLICATION

This application is related to U.S. patent application Ser. No. 10/800,121, filed on the same day as the instant application and entitled "DEVICE CARRIER SYSTEM." This application is hereby incorporated by reference in its entirety for all purposes.

BACKGROUND OF THE INVENTION

1. Field of the Invention

The present invention relates generally to computer network and network system components, and more specifically to a component device bracket assembly that provides for the component device to be installed into and removed from an array of component devices.

2. Description of the Related Art

Computer network server system and related components are typically housed in racks configured to house and to assimilate the functions of a plurality of component devices. System racks provide efficient organization for the plurality of components for ease of access, serviceability, expandability, power distribution, cooling, etc.

In a system rack, generally accepted and standardized sizes for the various component devices provide for efficient space utilization, ease and predictability of system configuration, serviceability, and facility location. A "rack unit" is generally accepted as being approximately 1.75 inches in height, and 17.5 inches in width, with a depth ranging from approximately 18 inches to approximately 36 inches to accommodate a plurality of component devices. A plurality of component devices are typically stacked, arrayed, or otherwise arranged within the rack, often with component devices in trays or drawers having a dimension of some multiple of a rack unit.

As is known, various system and network component devices require electrical connection as well as data connections to implement RAID array, mirroring, or other such redundancy of data and power. In the example of disk drives, the component devices are being developed in smaller and smaller dimension while accommodating more and more data. Concurrently, networks and network systems are being called on to accommodate and to process more and more data. Disk drive components, once having a form factor of 5.25 inches, have evolved to current industry standards of 3.5 and 2.5 inch form factors. An exemplary three rack unit tray can therefore house a correspondingly greater number of disk drive components in the available space. Efficient use of the space, while providing for necessary access and airflow, presents continuing challenges to the configuration and arrangement of disk drives, and other component devices within a system rack.

Disk drives of 3.5 inch and 2.5 inch form factors are typically arranged in a linear array within a system rack tray, also known as an array chassis. The disk drives are usually attached to a mid-plane or to one or more back-planes to provide the necessary electrical and data connections, and in a typical orientation of the component, the disk drive components are horizontally oriented and plugged into a vertically oriented mid-plane or back-plane. As used herein, a "horizontal orientation" describes a disk drive or other component device having a length "L" and a height "H", oriented in a space so that length L is the longer of the two dimensions L and H, and is positioned so that length L is parallel to the plane of the floor or base of the space in which the disk drive or other component device is positioned. Height H is therefore oriented perpendicular to the plane of the floor or base, and the horizontal orientation therefore positions the disk drive or other component device with a height H oriented vertically and being shorter than the length L.

In order to achieve more efficient use of system rack space, and correspondingly more robust networks and network systems, multiple component devices may be configured to a removable mid-plane or to one or more back-planes to provide both horizontal and vertical access for insertion and removal of individual component devices and a more dense arrangement of device arrays. In typical configurations, however, access to a single component device within an array requires a plurality of component devices to be taken off line. When returned to on line, the component devices may require data to be re-built to restore desired system processing and function. Such data re-build can take excessive amounts of time, which increases with the increasing numbers and capacity of component devices that can be accommodated on a single mid-plane spanning an array chassis due to smaller sizes of the component devices.

In consideration of the foregoing, what is needed is an efficient network and network system component device array, and method of connecting and arranging a plurality of component devices to increase device density, capacity, serviceability, and to achieve a maximum economy of space.

SUMMARY OF THE INVENTION

Broadly speaking, the present invention fills these needs by providing a computer component positioning and securing bracket assembly for disk drives and other components arranged in one or more linear arrays within an array chassis of a computer system rack. The present invention can be implemented in numerous ways, including as a process, an apparatus, a system, a device, or a method. Several embodiments of the present invention are described below.

In one embodiment, a component positioning and securing bracket assembly is provided. The component positioning and securing bracket assembly includes a front rail, a rear rail, and a bottom rail to define a front, a rear, and a bottom boundary of the component positioning and securing bracket assembly. The front rail, the rear rail, and the bottom rail define a structure into which is received the component. The component positioning and securing bracket assembly further includes a top plate for attaching to the component. The top plate includes a keyed tail portion. The component positioning and securing bracket assembly also includes a tail receptacle for receiving the keyed tail portion, and a nose receptacle portion of the front rail for receiving a nose portion of the top plate. Also included are a component connector to connect to a port of the component, and a lever to provide leveraged motion. The leveraged motion effects a connection of the port of the component and the component connector and secures the component in the component positioning and securing bracket. The component positioning and securing bracket assembly is in an array of a plurality of components.

In another embodiment, a disk drive positioning and securing bracket assembly in an array of a plurality of disk drive components is provided. The disk drive positioning and securing bracket assembly includes a device surrounding component for holding a disk drive, and a forward mounting post attached to an array chassis. The disk drive positioning and securing bracket assembly further includes a rear mounting post attached to the array chassis, and a lever to provide leveraged movement to the disk drive. The device surrounding component includes a device positioning key and forward tabs, The device positioning key and forward tabs are configured to be received in the rear mounting post and in the forward mounting post such that the device surrounding component having the disk drive therein is received in the rear mounting post and in the forward mounting post in a first direction of motion. The lever provides leveraged movement to secure the disk drive in a second direction of motion.

In a further embodiment, a disk drive array positioning and securing system in an array chassis of a computer system rack is provided. The disk drive array positioning and securing system includes a plurality of computer disk drives. The plurality of disk drives are arranged in at least one linear array within the array chassis. Each one of the plurality of disk drives includes a disk drive bracket for positioning and securing the disk drive, and a power and data connector for receiving a power and data connection port of the disk drive. The disk drive bracket for each one of the plurality of disk drives provides for movement of the disk drive in two directions of movement. Each one of the plurality of disk drives is capable of being inserted into and removed from the linear array of disk drives independently of essentially every other one of the plurality of disk drives.

The advantages of the present invention over the prior art are numerous and will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

An invention for a bracket assembly and system for securing and arranging computer components in one or more linear arrays is described. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
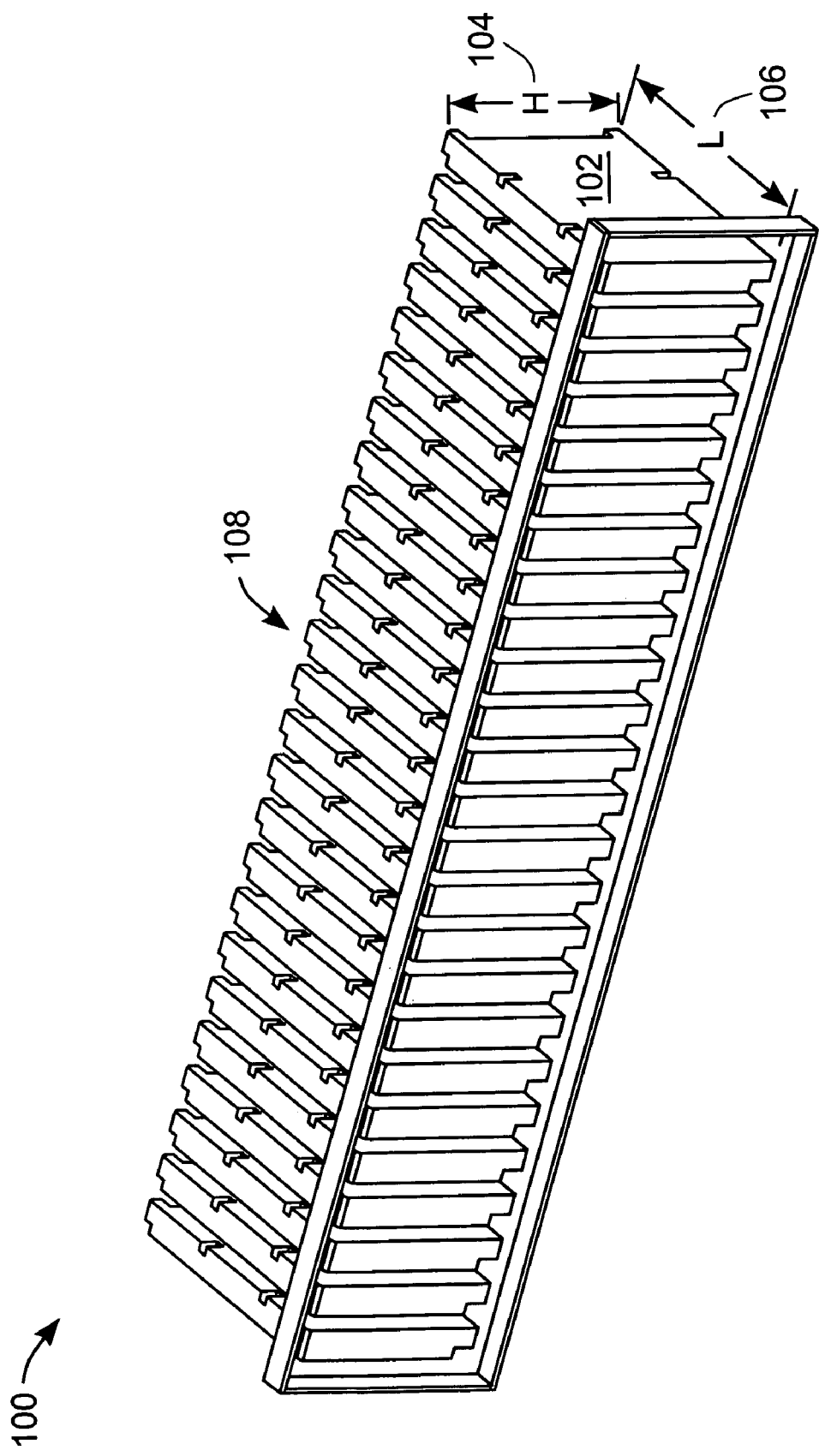
FIG. 1A is an array of computer component devices in a horizontally oriented component device array.
Figure 3A:
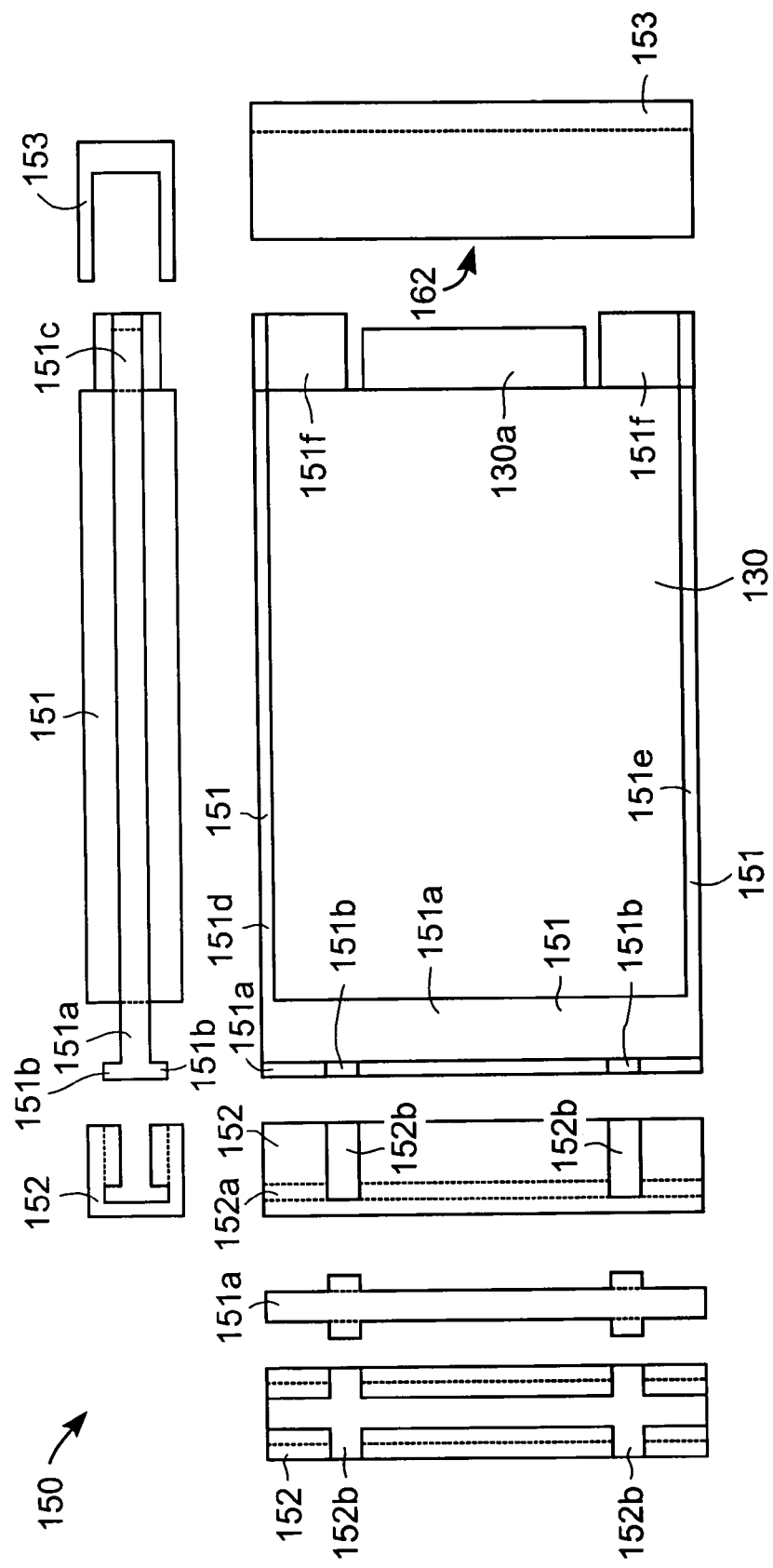
FIG. 3A shows an overview illustration of an exemplary component device, a computer hard drive, and a mounting and positioning bracket assembly, in accordance with one embodiment of the present invention.

FIG. 1A is an array 100 of computer component devices 102 in a horizontally oriented component device 102 array. As used herein, "component devices," or "network component devices" include network servers, routers, disk drive and other mass storage devices, tape back-up devices, and other similar related, generally computer components. Each component device 102 in FIG. 3A is oriented so that height "H" 104 is less than length "L" 106, with a typical height H 104 being easily accommodated by a system rack tray or drawer that is approximately three rack units in height. The term "array chassis," as used herein, is intended to convey the interior space of a system rack tray or drawer, within which an array of component devices is disposed.

In one embodiment, component devices 102 are computer disk drives. Disk drives, once having a form factor of 5.25 inches, have evolved to current industry standards of 3.5 and 2.5 inch form factors. An exemplary three rack unit tray can therefore house a correspondingly greater number of disk drives in the available space. Array 100 illustrates an arrangement of a plurality of disk drives, or other component devices 102, to achieve increasing data density, as well as necessary data redundancy. Illustrated component devices 102 are horizontally oriented, and in the example of disk drives, the horizontal orientation requires movement in a horizontal or lateral direction of the disk drive to connect with a vertically oriented power and data connector in a mid-plane 108, as is described in greater detail below.

Figure 1B:
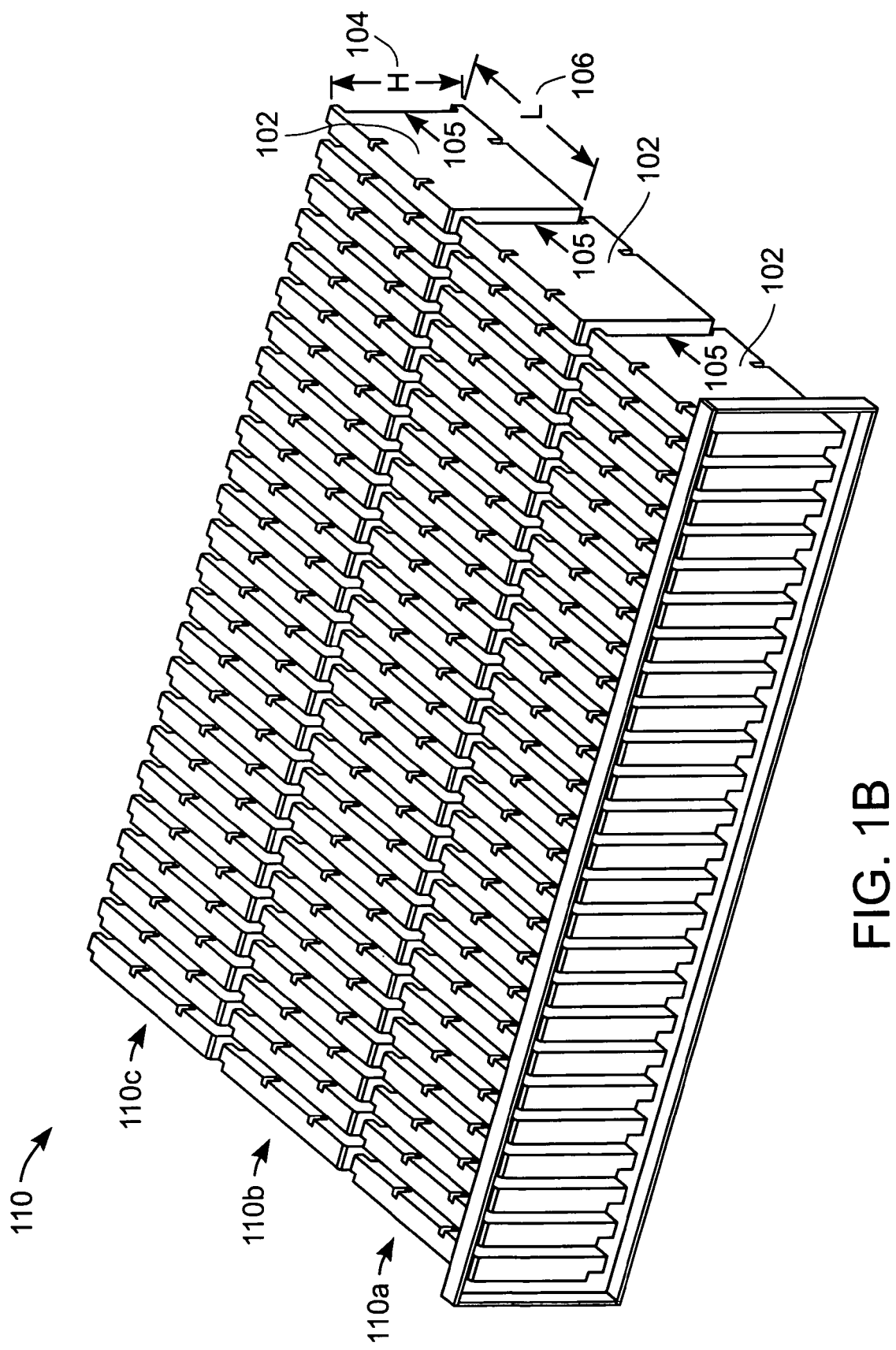
FIG. 1B shows a plurality of arrays, arranged in parallel arrays, of component devices in accordance with one embodiment of the present invention.

FIG. 1B shows a plurality of arrays 110, arranged in parallel arrays 110a, 110b, 110c, of component devices 102 in accordance with one embodiment of the present invention. Each of the parallel arrays 110a, 110b, and 110c, includes a plurality of component devices 102 in a horizontal orientation in which the height H 104 is less than the length L 106. In one embodiment, each of the component devices 102 are rigidly mounted, are connected to data and power at a rear surface 105, and have sufficient space around each component device 102 for airflow, cooling, access, etc. A plurality of arrays 110, provide significant desirable increase in density, but present configuration challenges for access and connection. In the example of disk drives, a vertically oriented data and power connector (not shown in FIG. 1B) is typically provided on a mid-plane (not shown in FIG. 1B), with one mid-plane provided for each of the parallel arrays 110a, 110b, 110c. In one embodiment of the invention, each component device 102 in each of the parallel arrays 110a, 110b, 110c, is individually accessible. In other words, each component device is capable of being connected to or disconnected from its corresponding data and power connector without requiring that adjacent component devices 102 or entire arrays 110a, 110b, 110c, of component devices 102 be disconnected, connected, or otherwise impacted.

In the illustrated configuration, access to each of the disk drives (component devices 102) for connecting to or disconnecting from one of the parallel arrays 110a, 110b, 110c, requires vertical access to insert the disk drive into, or extract the disk drive from, the array, and some horizontal or lateral motion to connect or disconnect the power and data connection. It is desirable that access and enablement to connect a disk drive to or disconnect a disk drive from within one of the parallel arrays 110a, 110b, 110c, can be accomplished without requiring that some or all adjacent disk drives in one of the parallel arrays 110a, 110b, 110c, be disconnected or taken off line. It should be appreciated that the illustrated arrangement of component devices 102 is exemplary and not exclusive or limiting. In other arrangements, a component device 102 within one or more arrays may require motion in some other plane or direction such as, for example, "in" and "over," or "up" and "back," etc.

FIGS. 2A-2E illustrate a computer hard drive 130, and associated hardware capable of being configured into one of a plurality of parallel arrays, such as the plurality of arrays 110 illustrated in FIG. 1B. A computer hard drive 130 is used to illustrate various embodiments of the present invention as representative of a component device requiring multiple connections, and as a component device that would provide added value or benefit to a network or system when configured in a plurality of arrays in accordance with embodiments of the present invention. Although a computer hard drive is illustrative of a component device, the present invention is not limited to a hard drive implementation, and any suitable component device can be implemented with embodiments of the present invention.

Figure 2A:
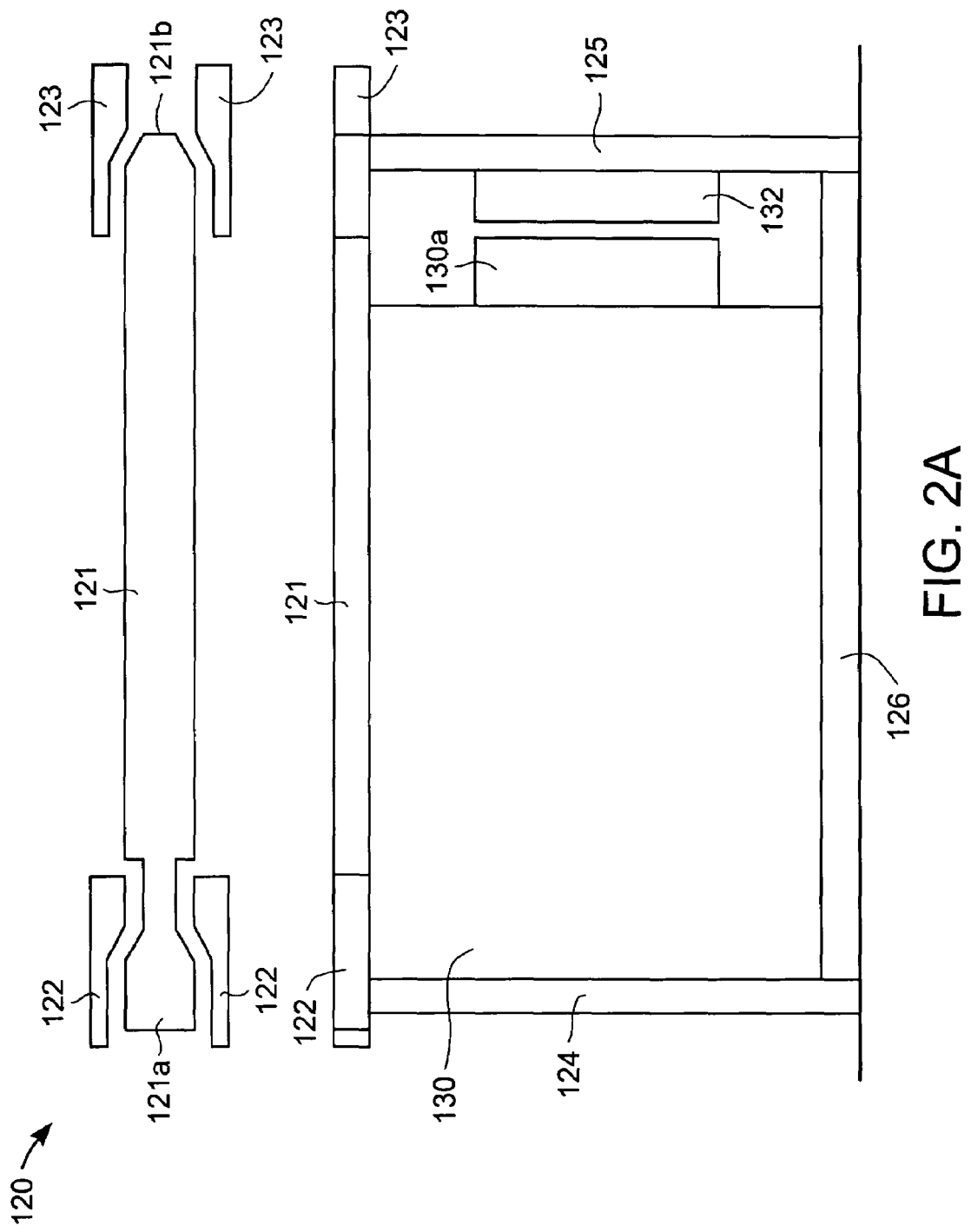
FIG. 2A shows an overview illustration of a computer hard drive and bracket assembly in accordance with one embodiment of the present invention.

FIG. 2A shows an overview illustration of a computer hard drive 130 and bracket assembly 120 in accordance with one embodiment of the present invention. In one embodiment of the invention, a computer hard drive 130, or other such component device, is configured with a mounting and positioning bracket assembly 120 to enable arrangement of a plurality of computer hard drives 130 in a plurality of arrays of devices within an array chassis such as a drawer of a computer rack. The arrangement of each computer hard drive includes the providing of a secure and stable mounting of the hard drive, and the enabling, in one embodiment, of both vertical insertion into and extraction from an array of hard drives, and horizontal or lateral movement for connection and disconnection of the hard drive to and from a power and data connector. The enablement of the exemplary vertical access as well as horizontal or lateral movement and leverage of hard drive 130 is particularly useful and desirable when an array of hard drives is one of a plurality of arrays of hard drives. In an array chassis, a plurality of arrays of hard drives, by way of example, provide for increased data density, and require efficient arrangement and configuration to maximize utilization of available space within the constraints of, for example, a three rack unit volume space. In one embodiment of the present invention, bracket assembly 120 further provides for necessary airflow and circulation within an array as well as within a plurality of arrays of hard drives.

As illustrated in FIG. 2A, bracket assembly 120 includes a number of component parts in addition to the computer hard drive 130 (hereinafter hard drive 130) to which bracket assembly 120 is attached. Bracket assembly 120 component parts include top plate 121 having a keyed tail 121a and a nose 121b, attached to an edge of the hard drive 130, in one embodiment. A tail receptacle 122 and a nose receptacle 123 are attached to an upper portion of bracket assembly 120, and are configured to receive the keyed tail 121a and the nose 121b, respectively. Rear rail 124, front rail 125, and bottom rail 126 are provided to define a rigid structure or framework within which hard drive 130 is positioned. A power and data connector 132 is attached to front rail 125, and is configured to mate with power and data port 130a of hard drive 130.

Figure 2B:
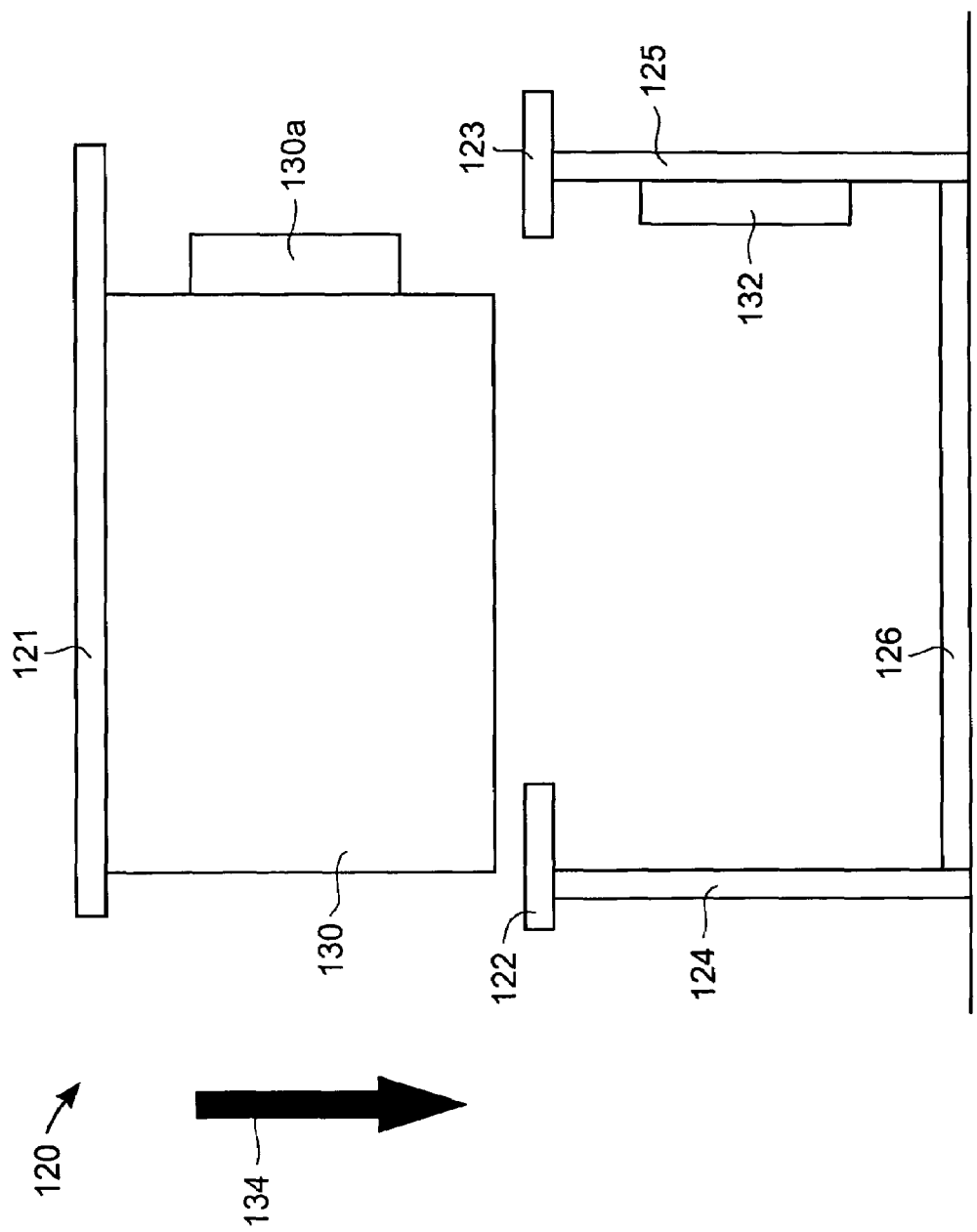
FIG. 2B illustrates the vertical insertion of hard drive into an array of hard drives, in accordance with one embodiment of the present invention.

FIG. 2B illustrates the vertical insertion 134 of hard drive 130 into an array of hard drives (not shown), in accordance with one embodiment of the present invention. Top plate 121 is attached to upper edge of hard drive 130, and may serve as a surface to grasp when lowering 134 hard drive 130 into bracket assembly 120 and array of hard drives (not shown). Rear rail 124 and front rail 125 provide structure and rigidity, and define the front and rear boundaries of bracket assembly 120 within which hard drive 130 is positioned. Bottom rail 126 defines a bottom or lower boundary of bracket assembly 120 which, in one embodiment, ensures correct alignment between power and data connector 132 and power and data port 130a for subsequent connection.

In one embodiment of the invention, tail receptacle 122 and nose receptacle 123 may serve to align and to guide hard drive 130 as hard drive 130 is lowered 134 into bracket assembly 120 and array of hard drives (not shown). When hard drive 130 comes to rest on bottom rail 126 at the extent of vertical travel, tail receptacle 122 receives keyed tail 121a (see FIG. 2A), and nose receptacle 123 receives nose 121b (see FIG. 2A), within. In one embodiment, tail receptacle 122 is configured to mate with keyed tail 121a, and nose receptacle 123 is configured to mate with nose 121b to securely position and affix hard drive 130 in place, as is described in greater detail below. In one embodiment, component parts of bracket assembly 120, such as tail receptacle, 122, nose receptacle 123, bottom rail 126, etc., are constructed of a hard plastic, a light-weight alloy, or other such similar material to provide strength, security, and rigidity, are light in weight and easily manufactured, and do not generate particles when component parts come into contact such as when hard drive is moved vertically into or out of an array of hard drives, or during connection to or disconnection from power and data.

Figure 2C:
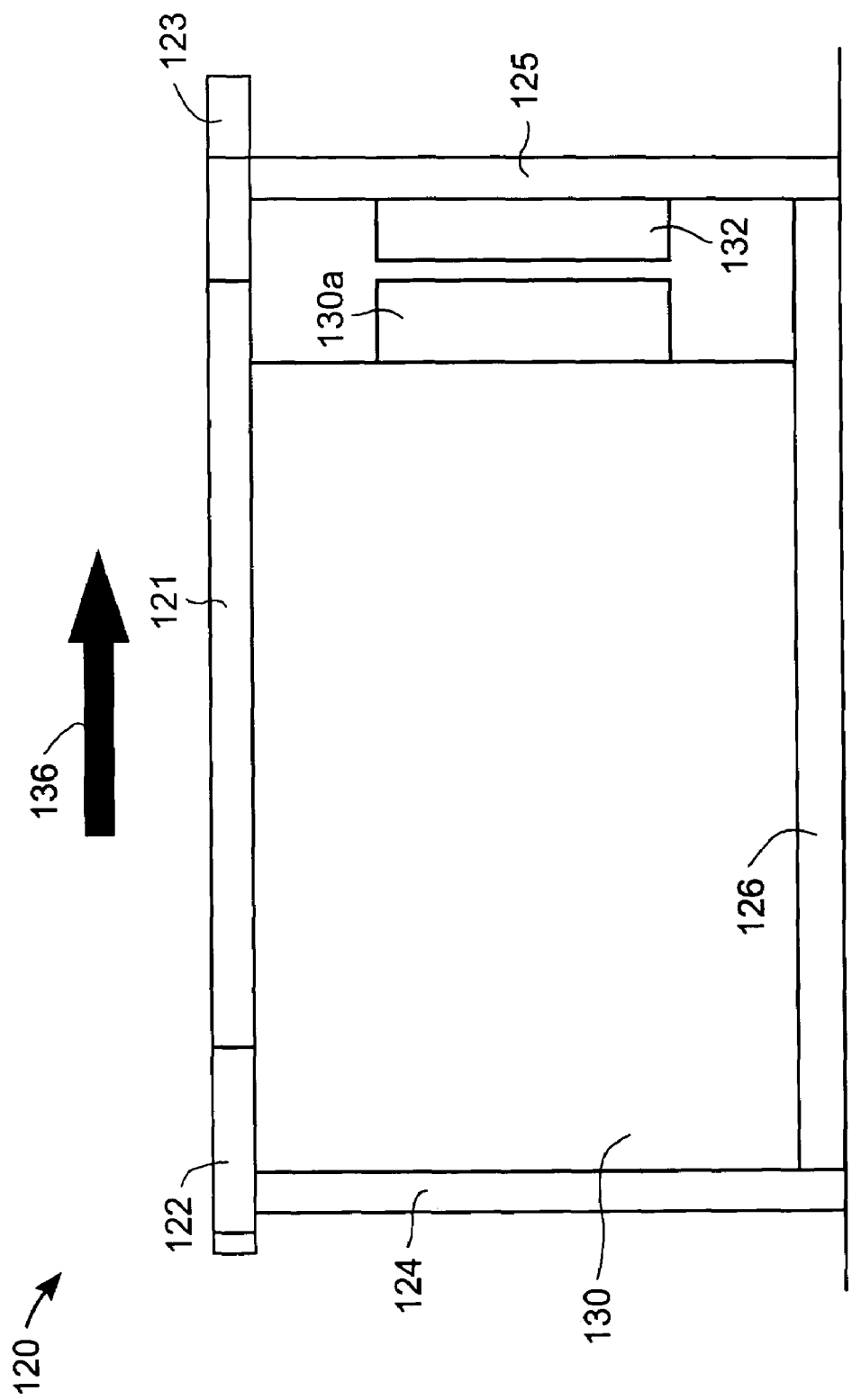
FIG. 2C illustrates bracket assembly at the extent of vertical insertion in accordance with one embodiment of the invention.

FIG. 2C illustrates bracket assembly 120 at the extent of vertical insertion in accordance with one embodiment of the invention. Hard drive 130 is shown in contact with bottom rail 126. Power and data port 130a of hard drive 130 is aligned with power and data connector 132. In one embodiment, power and data connector 132 is attached to, and a component of a mid-plane or back-plane (not shown) through which data and power is provided to power and data connector 132. Front rail 125 provides structure and support to bracket assembly 120, as well as strength and rigidity to enable a positive connection when hard drive 130 is moved horizontally 136 to effect connection between power and data port 130a and power and data connector 132. Additionally, front rail 125 provides necessary strength and rigidity to enable disconnection of power and data port 130a from power and data connector 132, so that mid-plane or back-plane (not shown) is not required to absorb and withstand the force imparted during connection and disconnection.

In FIG. 2C, top plate 121 is shown level or in the same plane as tail receptacle 122 and nose receptacle 123. As is described in greater detail below in reference to FIG. 2E, keyed tail 121a and a nose 121b (see FIG. 2A) of top plate 121 are received into tail receptacle 122 and nose receptacle 123 respectively.

From the extent of vertical motion during insertion of hard drive 130 shown in FIG. 2C, hard drive 130 is moved horizontally 136 to effect connection of power and data port 130a with power and data connector 132.

Figure 2D:
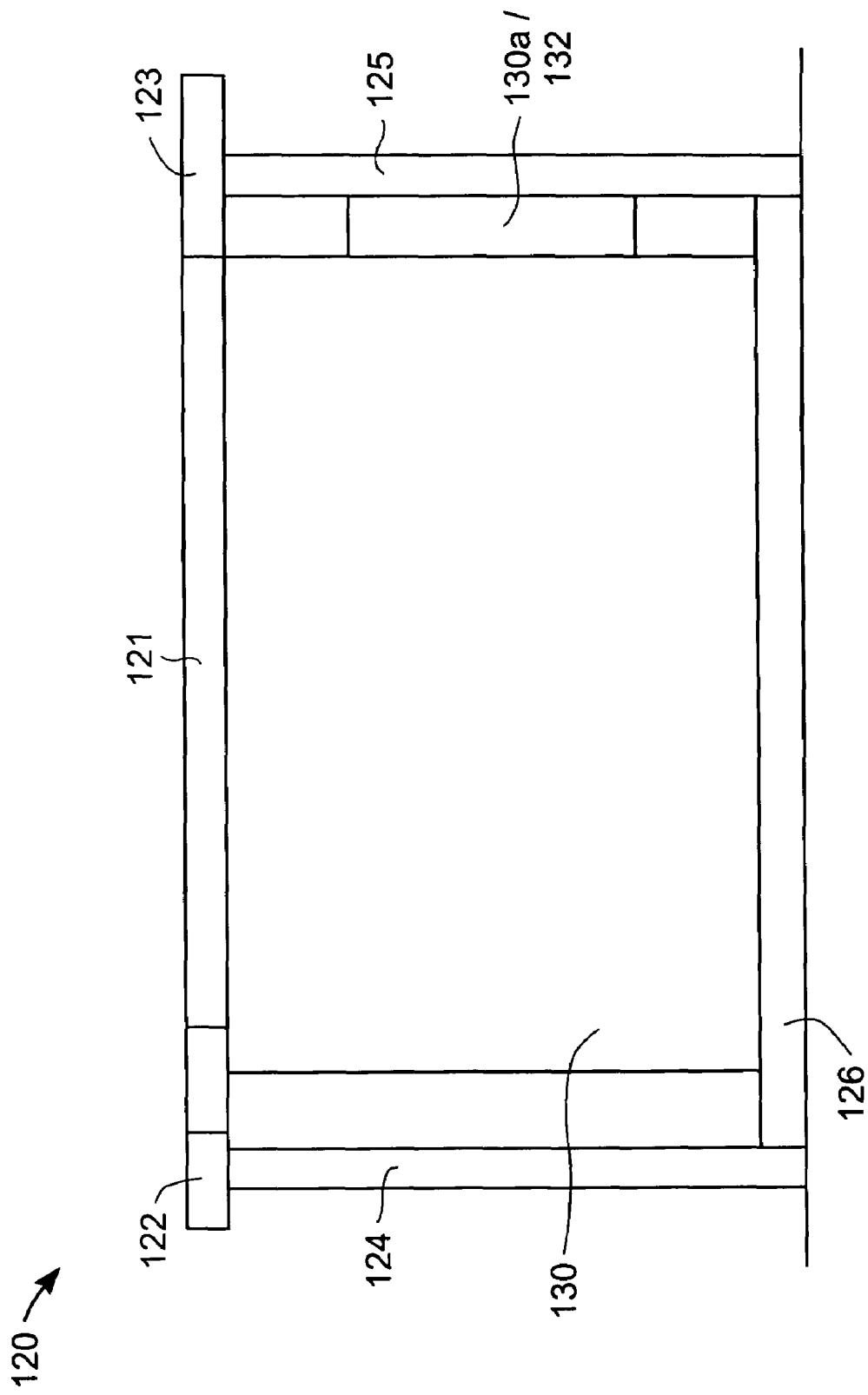
FIG. 2D illustrates bracket assembly at the extent of horizontal movement resulting in connection of power and data port of hard drive to power and data connector in accordance with one embodiment of the present invention.

FIG. 2D illustrates bracket assembly 120 at the extent of horizontal movement resulting in connection of power and data port 130a of hard drive 130 to power and data connector 132 in accordance with one embodiment of the present invention. Hard drive 130 is in contact with bottom rail 126, and power and data port 130a is shown connected to, or mated with, power and data connector 132. As is described in greater detail below in reference to FIG. 2E, keyed tail 121a and a nose 121b (see FIG. 2A) of top plate 121 have been received into tail receptacle 122 and nose receptacle 123 respectively, and have been moved horizontally 136 (see FIG. 2C) to effect mating or connection to positively hold and rigidly support hard drive 130 in place.

Figure 2E:
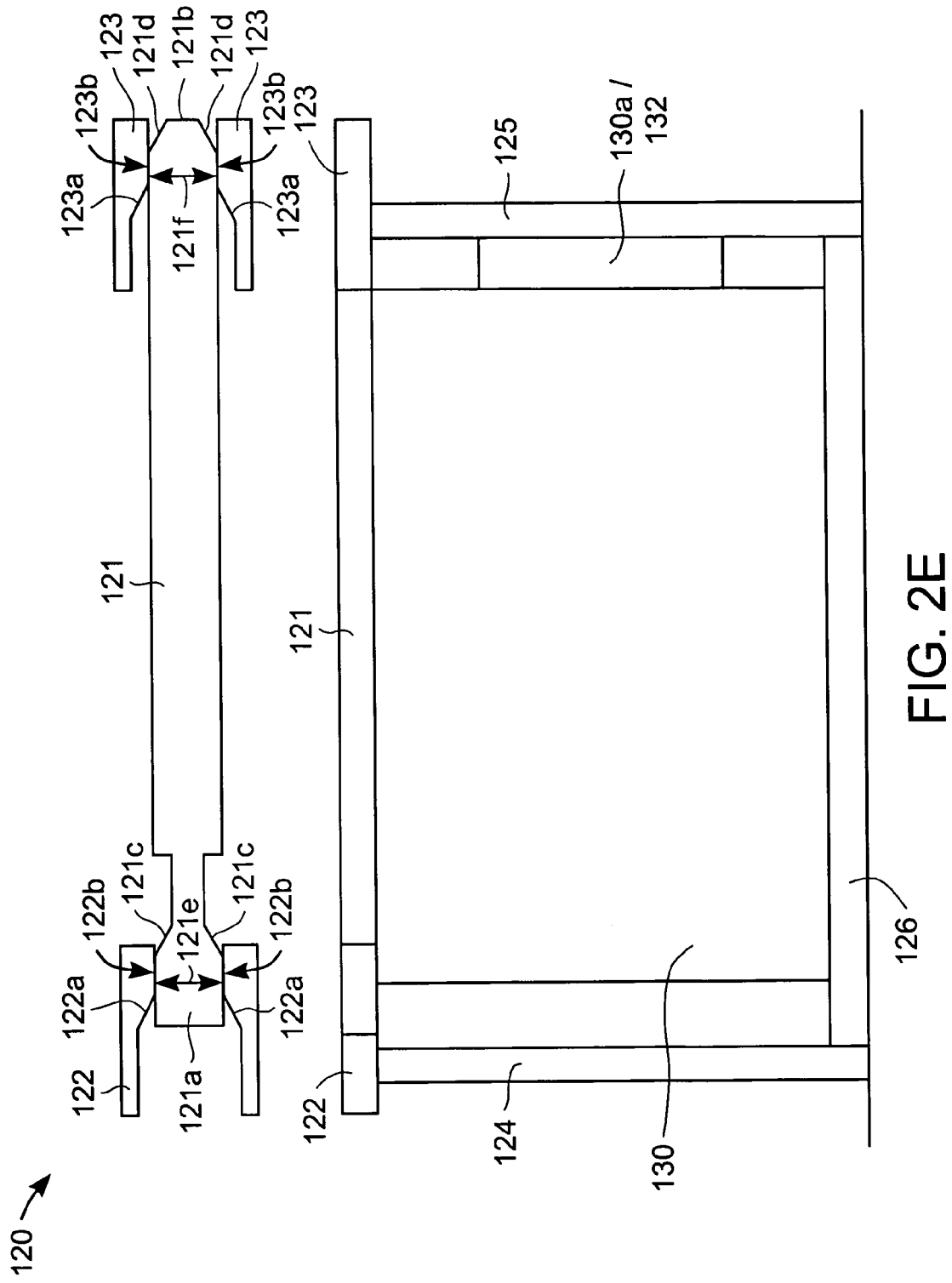
FIG. 2E shows a detail view of bracket assembly in place with connection of power and data port of hard drive and power and data connector in accordance with one embodiment of the present invention.

FIG. 2E shows a detail view of bracket assembly 120 in place with connection of power and data port 130a of hard drive 130 and power and data connector 132 in accordance with one embodiment of the present invention. FIG. 4E includes a top view of top plate 121 with keyed tail 121a seated in tail receptacle 122, and nose 121b seated in nose receptacle 123. In one embodiment of the invention, keyed tail 121a includes beveled edges 121c that are guided by tail receptacle beveled edges 122a to effect proper alignment and rigid support of hard drive 130 while hard drive 130 is moved horizontally 136 (see FIG. 2C) during insertion of hard drive 130, making connection between power and data port 130a and power and data connector 132. Similarly, nose beveled edges 121d are guided by nose receptacle beveled edges 123a to effect proper alignment and rigid support of hard drive 130 while hard drive 130 is moved horizontally 136 (see FIG. 2C) during insertion of hard drive 130, making connection between power and data port 130a and power and data connector 132.

In one embodiment of the invention, securing edges 121e of keyed tail 121a are received in throat 122b of tail receptacle 122, securing top plate 121 and hard drive 130 rigidly in place. Similarly, nose securing edges 121f are received in nose receptacle throat 123b, securing top plate 121 and hard drive 130 rigidly in place. In one embodiment of the invention, as hard drive 130 is moved horizontally 136 (see FIG. 2C) to seat connection between power and data port 130a and power and data connector 132, top plate 121 is guided by tail receptacle 122 and nose receptacle 123 assisting in maintaining correct lateral alignment to make the power and data connection. As the power and data connection is being made, the tail receptacle 122 and the nose receptacle 123 secure the top rail 121 and hard drive 130 in place, ensuring the stable and secure positioning of hard drive 130 in an array of hard drives (see FIGS. 1A and 1B).

In the illustrated embodiment, keyed tail beveled edges 121c, tail receptacle beveled edges 122a, nose receptacle beveled edges 123a and nose beveled edges 121d, are configured to mate to secure hard drive 130 in place, as well as to release hard drive 130 during removal. That is, as hard drive 130 is moved horizontally, edges meet, guide, and assist with securing, or releasing, hard drive 130. In another embodiment (not illustrated), beveled edges on tail receptacle 122a and keyed tail beveled edges 121c, and/or beveled edges on nose receptacle 123a and nose beveled edges 121d are configured to include both a horizontal and a vertical component. In one embodiment, nose 121b, for example, is configured to slide into nose receptacle 123 during horizontal insertion, and further configured to slide under at least a portion of nose receptacle 123 with beveled edges on both the nose 121 and the nose receptacle 123 providing a vertical force component holding hard drive 130 both "in" to the data connection and "down" against bottom rail 126. Keyed tail 121a and tail receptacle 122 have a similar configuration in one embodiment.

FIGS. 2A-2E illustrate bracket assembly 120 and the insertion of an exemplary hard drive 130 in accordance with one embodiment of the invention. During both insertion of a hard drive 130 into an array of hard drives, and removal or extraction of a hard drive 130 from an array of hard drives in embodiments as illustrated in FIGS. 1A and 1B, vertical and horizontal motion is required. Bracket assembly 120 enables and provides for both vertical and horizontal movement of hard drive 130, or, in other embodiments, bracket assembly 120 enables and provides for movement in two directions in accordance with the arrangement of the applicable component devices. In a typical array or multiple arrays of hard drives, vertical access is available or can be easily achieved by opening a drawer, for example. Horizontal access, or access for horizontal leverage, however, may be blocked or unavailable, particularly in multiple arrays of hard drives as illustrated in FIG. 1B. FIGS. 4A and 4B below illustrate achievement of horizontal leverage or force to effect connection and disconnection between power and data port 130a and power and data connector 132. FIGS. 3A-3D are first provided to illustrate a bracket assembly configuration in accordance with another embodiment of the invention.

FIG. 3A shows an overview illustration of an exemplary component device, a computer hard drive 130, hereinafter hard drive 130, and a mounting and positioning bracket assembly 150, hereinafter bracket assembly 150, in accordance with one embodiment of the present invention. In one embodiment of the invention, a computer hard drive 130, or other such component device, is configured with an integral bracket assembly 150 to enable arrangement of a plurality of computer hard drives 130 in a plurality of arrays of devices within an array chassis. The arrangement of each computer hard drive 130 includes the providing of a secure and stable mounting of the hard drive 130, and the exemplary enabling of both vertical insertion into and extraction from an array of hard drives, and horizontal or lateral motion and leverage for connection and disconnection of the hard drive 130 to and from a power and data connector. In one embodiment of the present invention, bracket assembly 150 further provides for necessary airflow and circulation within an array as well as within a plurality of arrays of hard drives.

As illustrated in FIG. 3A, bracket assembly 150 includes a number of component parts in addition to the computer hard drive 130 to which bracket assembly 150 is attached, or otherwise configured. Bracket assembly 150 component parts include a device surrounding component 151, a rear mounting post 152, and a forward mounting post 153. Device surrounding component 151 includes a top rail 151d, a rear rail 151a having a "T-bar" device positioning key, a bottom rail 151e, and forward tabs 151f. Rear mounting post 152 includes keyway 152a and T-slots 152b, configured to receive and to guide T-bar device positioning key of rear rail 151a. In one embodiment, a power and data connector 162 is housed within forward mounting post 153, and is configured to mate with power and data port 130a of hard drive 130.

Figure 3B:
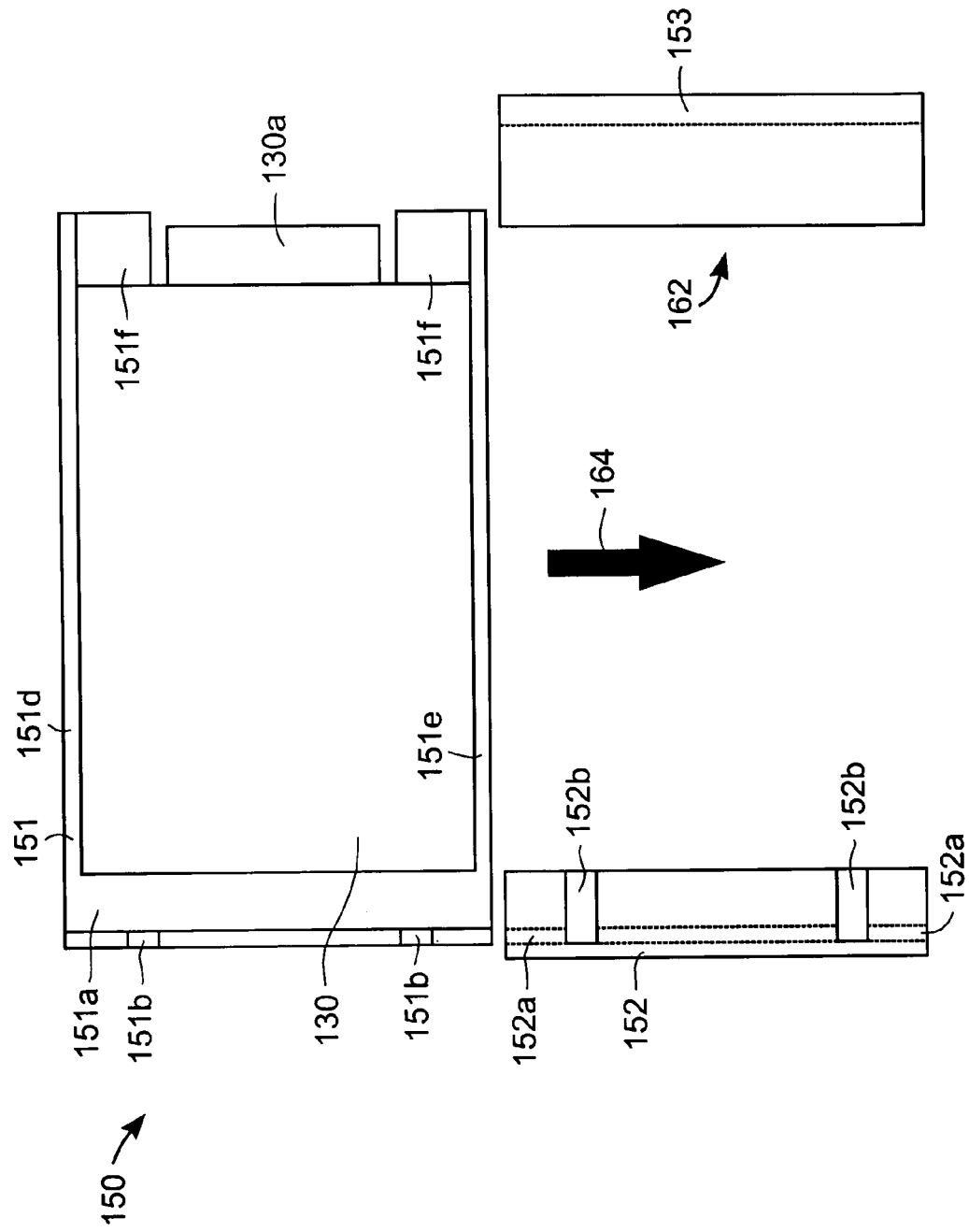
FIG. 3B illustrates the vertical insertion of hard drive into an array of hard drives, in accordance with one embodiment of the present invention.
Figure 4B:
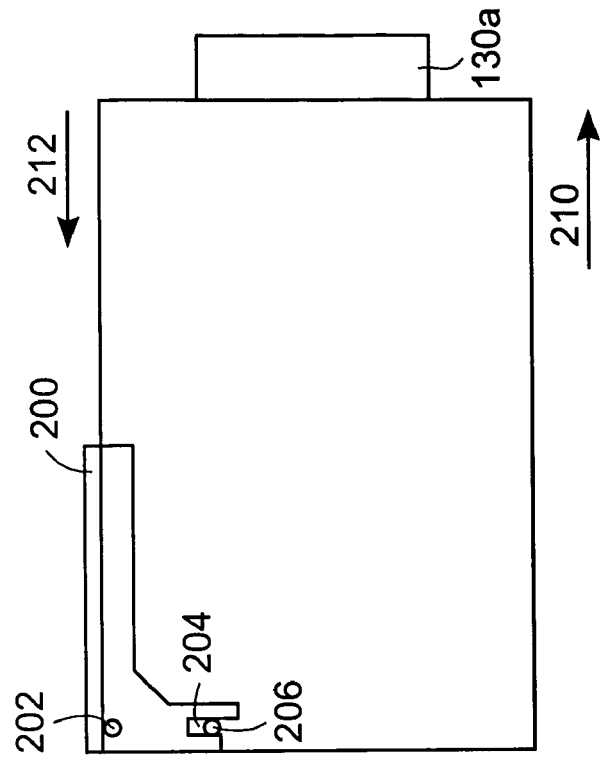
FIG. 4B illustrates a lever, attached to exemplary hard drive, in a down or closed position in accordance with one embodiment of the invention.
Figure 4A:
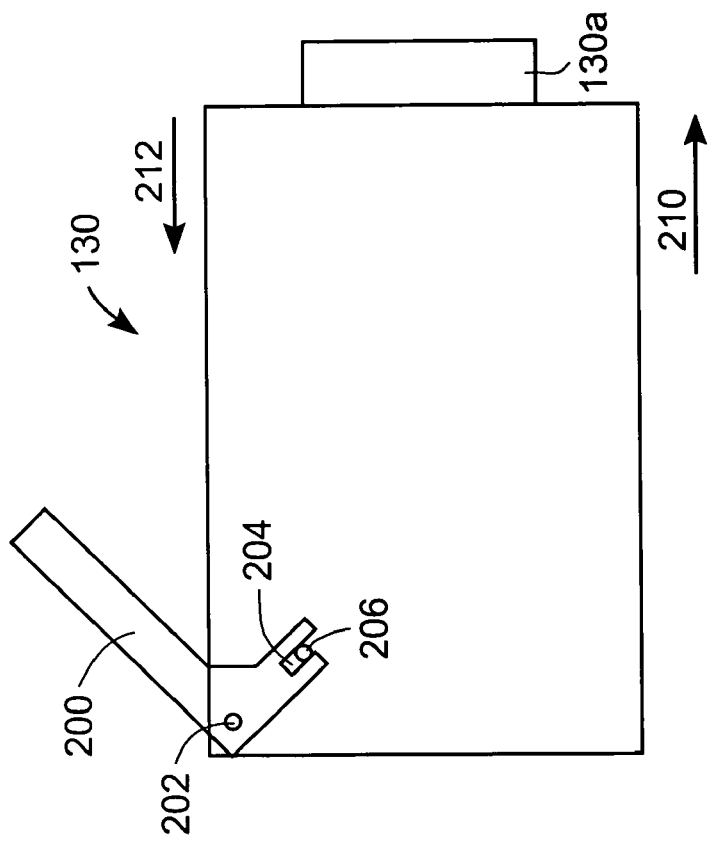
FIG. 4A illustrates a lever, attached to exemplary hard drive, in a raised position in accordance with one embodiment of the present invention.

FIG. 3B illustrates the vertical insertion 164 of hard drive 130 into an array of hard drives (not shown), in accordance with one embodiment of the present invention. Top rail 151d of device surrounding component 151, along with hard drive 130 may serve as a surface to grasp when lowering 164 hard drive 130 in place in an array of hard drives (not shown). Rear mounting post 152 and forward mounting post 153 provide structure and rigidity, and define the front and rear boundaries of bracket assembly 150 within which hard drive 130 is positioned and secured in an array of hard drives. Bottom rail 151e of device surrounding component 151 defines a bottom or lower boundary of bracket assembly 150 which, in one embodiment, ensures correct alignment between power and data connector 162 and power and data port 130a for subsequent connection.

In one embodiment of the invention, rear mounting post 152 and forward mounting post 153 serve to align and to guide hard drive 130 as hard drive 130 is lowered 164 into an array of hard drives (not shown). In one embodiment, forward mounting post 153 is a "U" shaped post defining an interior channel within which forward tabs 151f are guided, maintaining desired positioning and alignment. Keyway 152a of rear mounting post 152 is configured to receive T-bar device positioning key of rear rail 151a. Therefore, when lowering hard drive 130 into position, e.g. vertical motion 164, device surrounding component 151 is essentially received in front and rear slots to guide and position hard drive 130. At the extent of vertical travel 164, power and data port 130a will be aligned with power and data connector 162 in the front, and T-bar tabs 151b on T-bar device positioning key of rear rail 151a are aligned with T-slots 152b in keyway 152a of rear mounting post 152.

Figure 3C:
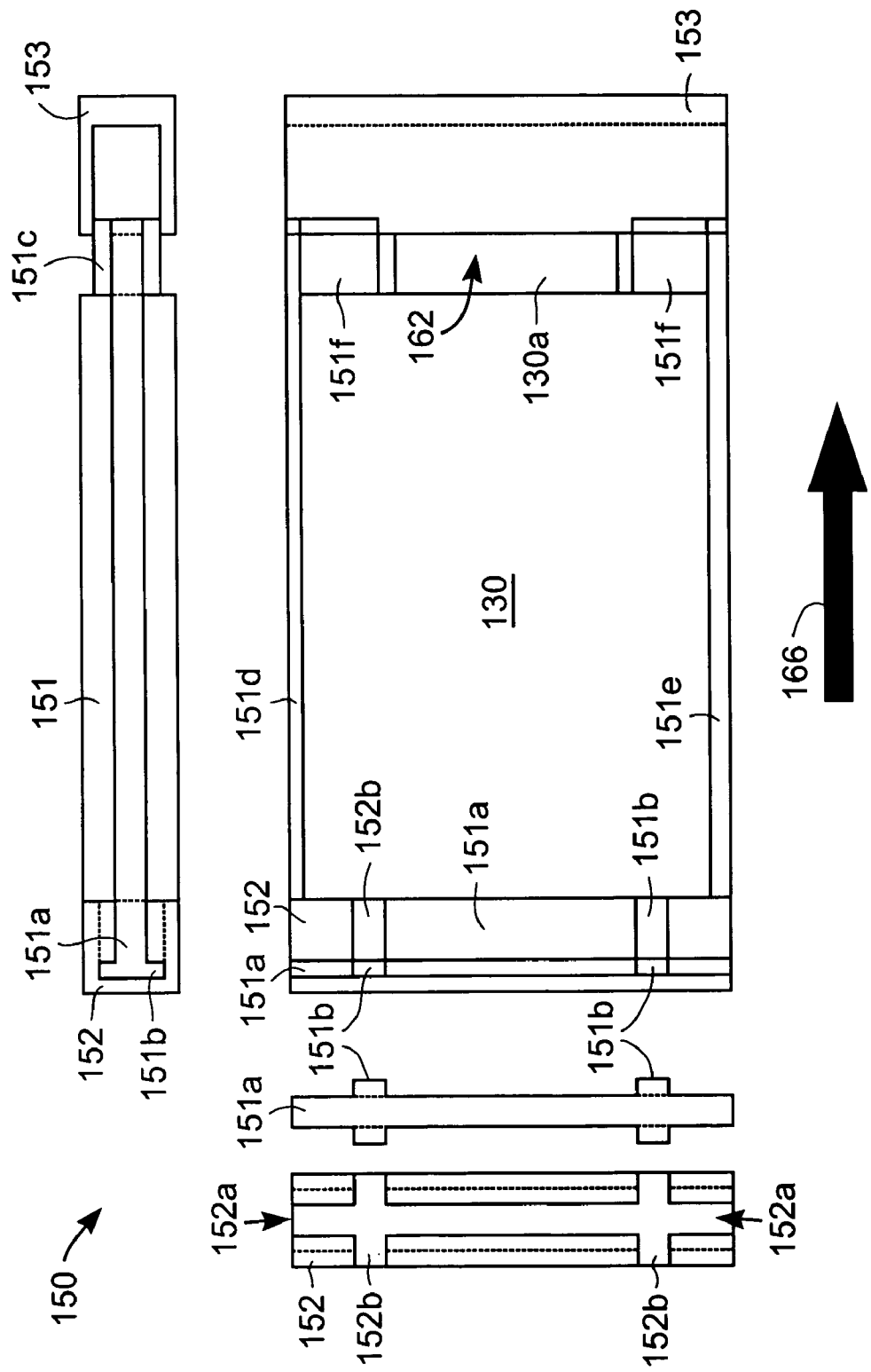
FIG. 3C illustrates a bracket assembly at the extent of vertical insertion in accordance with one embodiment of the invention.

FIG. 3C illustrates bracket assembly 150 at the extent of vertical insertion in accordance with one embodiment of the invention. Bottom rail 151e has reached the extent of downward vertical travel 164 (see FIG. 5B), and hard drive 130 is aligned for horizontal movement 166 and connection into an array of hard drives (not shown). Power and data port 130a of hard drive 130 is aligned with power and data connector 162 within forward mounting post 153. In one embodiment, power and data connector 162 is attached to, and a component of a mid-plane or back-plane (not shown) through which data and power is provided to power and data connector 122. Forward mounting post 153 provides structure and support to bracket assembly 150, as well as strength and rigidity to enable a positive connection when hard drive 130 is moved horizontally 166 to mate power and data port 130a with power and data connector 162. Additionally, forward mounting post 153 provides necessary strength and rigidity to enable disconnection of power and data port 130a from power and data connector 162, so that mid-plane or back-plane (not shown) is not required to absorb and withstand the force imparted during connection and disconnection.

As shown in FIG. 3C, T-bar device positioning key of rear rail 151a travels within keyway 152a of rear mounting post 152, supporting and guiding hard drive 130 until T-bar tabs 151b are aligned with T-slots 152b, permitting horizontal motion 166. Forward tabs 151f are received within the U-shaped channel of forward mounting post 153 which, in one embodiment, provides for sufficient surface area to support and align hard drive, while maintaining sufficient clearance to avoid interference with power and data connector 162. Horizontal movement 166 is enabled by T-bar tabs 151b moving through T-slots 152, and forward tabs 151f traveling outside of and adjacent to edges of power and data connector 162.

Figure 3D:
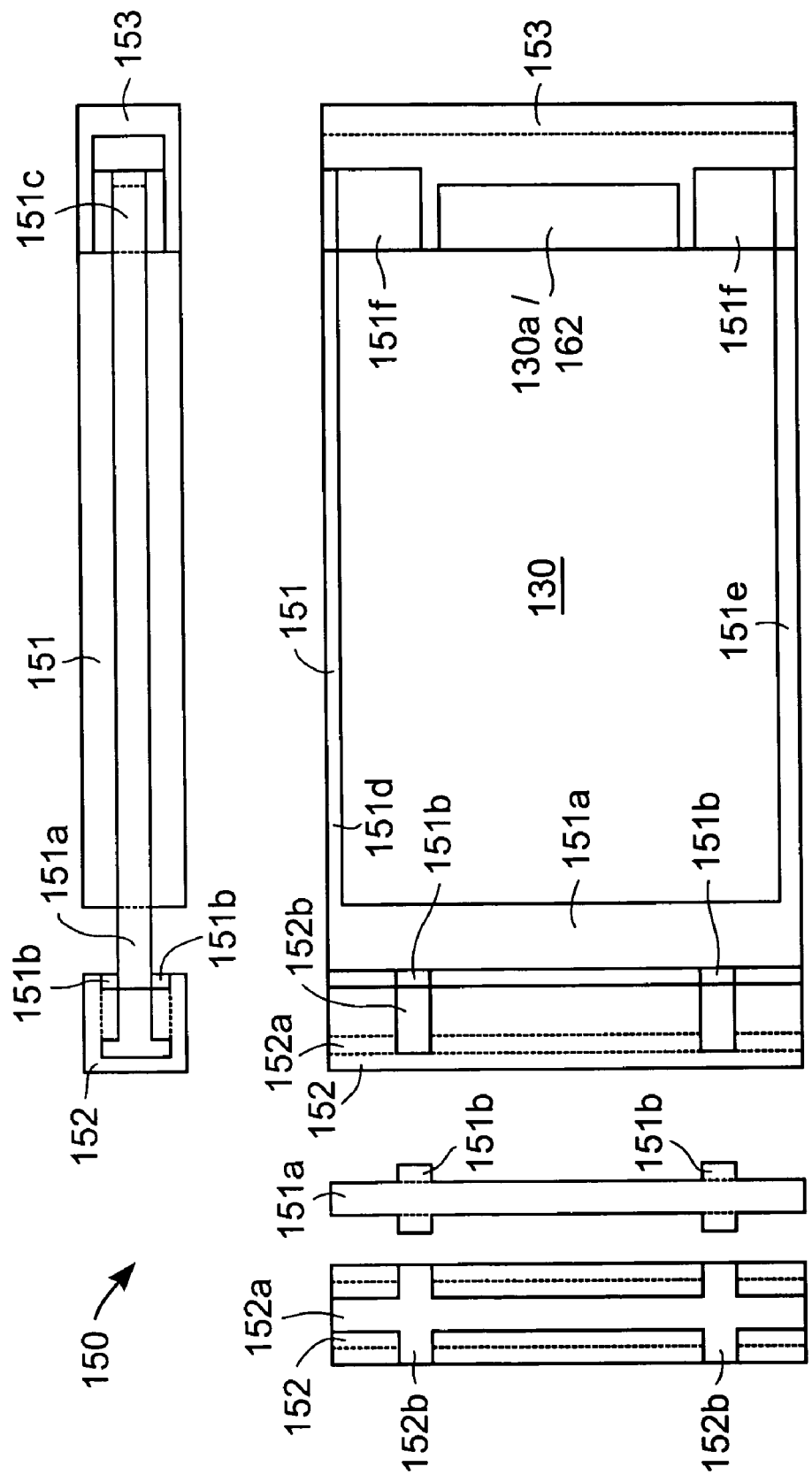
FIG. 3D illustrates a bracket assembly at the extent of horizontal movement, with hard drive seated in an array of hard drives, in accordance with an embodiment of the invention.

FIG. 3D illustrates bracket assembly 150 at the extent of horizontal movement, with hard drive 130 seated in an array of hard drives (not shown), in accordance with an embodiment of the invention. Following horizontal insertion movement, power and data port 130a of hard drive 130 is connected to power and data connector 162 in accordance with one embodiment of the present invention. T-bar tabs 151b have moved through T-slots 152, a distance sufficient to permit positive connection between power and data port 130a and power and data connector 162. In one embodiment, T-bar tabs 151b remain in a portion of T-slots 152 when hard drive is seated in place, ensuring rigid, stable, security of the hard drive 130.

In one embodiment of the invention, component parts of bracket assembly 150, such as device surrounding component 151, rear mounting post 152, a forward mounting post 153, and associated component parts, etc., are constructed of a hard plastic, a light-weight alloy, or other such similar material to provide strength, security, and rigidity, are light in weight and easily manufactured, and do not generate particles when component parts come into contact such as when hard drive is moved vertically into or out of an array of hard drives, or during connection to or disconnection from power and data.

As illustrated and described in FIGS. 2A-2E and 3A-3D, embodiments of the present invention enable and provide for movement of a hard drive or other component device in a vertical or first direction and in a horizontal or second direction. Therefore, if multiple arrays of component devices are configured, such as a configuration illustrated in FIG. 1B, a single component device in an interior region of any array can be accessed, extracted or removed from the array, and inserted or installed into the array without requiring any adjacent component device to be disconnected or taken off line, or even an entire array of component devices to be disconnected or taken off line. With the capability of both vertical and horizontal motion as described in embodiments of the present invention, a component device in essentially any location of any of a plurality of arrays of devices can be accessed, removed, or installed with only a minimum of vertical access clearance over the desired location. As described above, it should be appreciated that the illustrated arrangements requiring vertical and horizontal motion are exemplary only, and should not be interpreted to be exclusive or limiting. Accordingly, the terms "vertical" and "horizontal" are applicable to the orientation of the illustrated embodiments, but not to all embodiments of the present invention. In other embodiments, an arrangement or configuration of component devices may require motion in alternative directions or planes of motion. In the example of a system rack tray or drawer, a typical configuration provides for opening the drawer or tray with power and data connections maintained to all devices within the array chassis. By sliding the system rack tray or drawer out or open, sufficient vertical access is obtained, regardless of the density or depth of the multiple arrays of hard drives or other component devices.

FIGS. 4A and 4B illustrate a lever 200 to achieve sufficient leverage in the exemplary horizontal or lateral direction to achieve connection and disconnection between the data and power port 130a and the data and power connector 132, 162 (see FIGS. 2A and 3A, respectively). FIG. 4A illustrates lever 200 attached to exemplary hard drive 130 in a raised position in accordance with one embodiment of the present invention. Lever 200 is shown attached to exemplary hard drive 130 at pivot pin 202. Fixed pin 206 is received in slot 204 upon insertion of hard drive 130, and released by slot 204 upon removal of hard drive 130 from an array of hard drives as previously described. In one embodiment, fixed pin 206 is attached to a fixed structure such as, by way of example, rear mounting post 152 (see FIG. 3A) or rear rail 124 (see FIG. 2A). When fixed pin 206 is received in slot 204, lowering of lever 200 forces hard drive 130, which is not fixed in place, forward 210 which effects connection between data and power port 130a and data and power connector 132, 162.

FIG. 4B illustrates lever 200 attached to exemplary hard drive 130 in a down or closed position in accordance with one embodiment of the invention. As lever 200 is lowered, it pivots about pivot pin 202. Fixed pin 206 remains stationary, and so hard drive 130 is forced forward 210, in the illustrated embodiment, until fixed pin 206 and pivot pin 202 are aligned, lever 200 is aligned with edges of hard drive 130, and hard drive is connected to data and power connector 132, 162 (see FIGS. 2A and 3A, respectively). By reversing the above described process, that is, raising lever 200, hard drive 130 is forced backward 212, disconnecting the data and power port 130a from the data and power connector 132, 162.

In one embodiment of the invention, lever 200 is attached to hard drive 130 at pivot pin 202. In other embodiments, pivot pin 202 is attached to device surrounding component 151 (see FIG. 3A), or to top plate 121 (see FIG. 2A). As can be appreciated, because lever 200 pivots around pivot pin 202 to cause horizontal movement of hard drive 130, pivot pin 202 is attached to hard drive 130, or to a structure integral with hard drive 130. Conversely, fixed pin 206 is configured to define the space within which hard drive 130 moves, horizontally in one embodiment. In the illustrated embodiments, the space is an array or multiple arrays of hard drives. The fixed structures within such arrays include bracket components such as the rear rail 124 (see FIG. 2A), tail receptacle 122 (see FIG. 2A), rear mounting post 152 (see FIG. 3A), etc. In additional embodiments, the physical space of the arrays or multiple arrays is configured with a fixed structure to define a fixed pin 206, without interfering with the insertion or removal of hard drive 130.

Lever 200 is constructed of similar materials as those used to construct components already described. Hard plastic, a light-weight alloy, or other such similar material to provide strength, security, and rigidity, is light in weight and easily manufactured, and does not generate particles is suitable material for lever 200. Similarly, pivot pin 202 and fixed pin 206 can be constructed of hard plastic, light weight alloy, or other similar durable and light weight, easily manufactured material. Due to the function of both pivot pin 202 and fixed pin 206, durability and particle generation are primary considerations when selecting a suitable material.

In another embodiment of the invention (not illustrated), a bracket includes a device-surrounding cage. Similar to the embodiment illustrated in FIGS. 3A-3D, the device-surrounding cage functions similar to the device surrounding component 151 (see FIG. 3A), but would encase all sides of the exemplary hard drive 130. A device-surrounding cage may include the pivot pin 202 (FIGS. 4A, 4B) attachment, thereby eliminating an attachment directly to the exemplary hard drive 130.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A component positioning and securing bracket assembly, comprising:
   a front rail, a rear rail, and a bottom rail to define a front, a rear, and a bottom boundary of the component positioning and securing bracket assembly, the front rail, the rear rail, and the bottom rail defining a structure into which is received the component;
   a top plate for attaching to the component, the top plate including a keyed tail portion;
   a tail receptacle for receiving the keyed tail portion, the tail receptacle configured to the rear rail;
   a nose receptacle portion of the front rail for receiving a nose portion of the top plate;
   a component connector to connect to a port of the component; and
   a lever to provide leveraged motion, the leveraged motion causing the keyed tail portion to be received into the tail receptacle to positively hold and rigidly support the component in place and effecting a connection of the port of the component and the component connector and securing the component in the component positioning and securing bracket,
   wherein the component positioning and securing bracket assembly is in an array of a plurality of components.

2. The component positioning and securing bracket assembly of claim 1, wherein the array of a plurality of components is one array of a plurality of arrays in an array chassis.

3. The component positioning and securing bracket assembly of claim 2, wherein the component is a computer component and the plurality of arrays in the array chassis is a plurality of arrays of computer components in the array chassis of a computer system rack.

4. The component positioning and securing bracket assembly of claim 2, wherein when the leveraged motion provides horizontal motion to secure the component in the component positioning and securing bracket assembly within the one array of a plurality of arrays in an array chassis.

5. The component positioning and securing bracket assembly of claim 1, wherein the component is a computer component.

6. The component positioning and securing bracket assembly of claim 5, wherein the computer component is a hard drive.

7. The component positioning and securing bracket assembly of claim 1, wherein the component connector is attached to the front rail and wherein the bottom rail defines a lower boundary of the component positioning and securing bracket assembly such that when the component is received in the structure defined by the front rail, the rear rail, and the bottom rail, the port of the component is aligned with the component connector.

8. The component positioning and securing bracket assembly of claim 1, wherein the component connector provides power to the component.

9. The component positioning and securing bracket assembly of claim 1, wherein the component connector provides power and data to the component.

10. In an array of a plurality of disk drive components, a disk drive positioning and securing bracket assembly, comprising:
    a device surrounding component for holding a disk drive;
    a forward mounting post attached to an array chassis;
    a rear mounting post attached to the array chassis; and
    a lever to provide leveraged movement to the disk drive, the lever positioned on a side surface of the disk drive to be located within the array of the plurality of disk drive components,
    wherein the device surrounding component includes a device positioning key and forward tabs, the device positioning key and forward tabs configured to be received in the rear mounting post and in the forward mounting post such that the device surrounding component having the disk drive therein is received in the rear mounting post and in the forward mounting post in a first direction of motion, and the lever provides leveraged movement in a second direction of motion positioning the device positioning key into the forward tabs to secure the disk drive.

11. The disk drive positioning and securing bracket assembly of claim 10, further comprising:
a power and data connector disposed within the forward mounting post; and
T-slots formed in the rear mounting post,
wherein when the lever provides leveraged movement in the second direction of motion to secure the disk drive, the device positioning key moves through the T-slots and a power and data port of the disk drive mates with the power and data connector.

12. The disk drive positioning and securing bracket assembly of claim 11, wherein when the lever provides leveraged movement to secure the disk drive, the forward tabs are disposed within the forward mounting post and adjacent to the power and data connector.

13. The disk drive positioning and securing bracket assembly of claim 10, wherein the array of a plurality of disk drive components is disposed within an array chassis having a plurality of arrays of disk drive components.

14. The disk drive positioning and securing bracket assembly of claim 10, wherein the rear mounting post includes a keyway for receiving the device positioning key in the first direction of motion.

15. The disk drive positioning and securing bracket assembly of claim 10, wherein the disk drive positioning and securing bracket assembly is constructed of materials including hard plastic and stainless steel alloy.

16. The disk drive positioning and securing bracket assembly of claim 10, wherein the first direction of motion is a vertical direction of motion and the second direction of motion is a horizontal direction of motion.

* * * * *